(12) United States Patent
Gao (10) Patent No.: US 9,431,544 B2
(45) Date of Patent: Aug. 30, 2016

(54) POLYSILICON THIN-FILM TRANSISTOR ARRAY SUBSTRATE AND METHOD FOR PREPARING THE SAME, AND DISPLAY DEVICE

(71) Applicant: BOE TECHNOLOGY GROUP CO., LTD., Beijing (CN)

(72) Inventor: Tao Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/552,662

(22) Filed: Nov. 25, 2014

(65) Prior Publication Data

US 2016/0020333 A1    Jan. 21, 2016

(30) Foreign Application Priority Data

Jul. 18, 2014  (CN) .......................... 2014 1 0345316

(51) Int. Cl.
*H01L 29/786*   (2006.01)
*H01L 29/66*    (2006.01)
(Continued)

(52) U.S. Cl.
CPC ....... *H01L29/66765* (2013.01); *H01L 21/0262* (2013.01); *H01L 21/02532* (2013.01); *H01L 28/40* (2013.01) *H01L 29/78678* (2013.01); *H01L 21/308* (2013.01); *H01L 21/31* (2013.01); *H01L 21/31144* (2013.01); *H01L 21/324* (2013.01); *H01L 21/32139* (2013.01); *H01L 27/124* (2013.01); *H01L 27/1218* (2013.01); *H01L 27/1248* (2013.01); *H01L 27/1255* (2013.01); *H01L 27/1274* (2013.01); *H01L 29/04* (2013.01); *H01L 29/42384* (2013.01);

(Continued)

(58) Field of Classification Search
CPC .................. H01L 29/66765; H01L 29/42384; H01L 21/31; H01L 21/308; H01L 29/78678
See application file for complete search history.

(56) References Cited

U.S. PATENT DOCUMENTS 4,904,611 A * 2/1990 Chiang ............... H01L 21/2022
                                                                 438/486

(Continued)

FOREIGN PATENT DOCUMENTS

CN          1794452 A       6/2006
CN          103227150 A     7/2013

OTHER PUBLICATIONS

First Chinese Office Action regarding Application No. 2014103453164 dated May 31, 2016. English translation provided by Dragon Intellectual Property Law Firm.

*Primary Examiner* — Daniel Whalen
*Assistant Examiner* — Suberr Chi
(74) *Attorney, Agent, or Firm* — Harness, Dickey & Pierce, P.L.C.

(57) ABSTRACT

The present invention provides a polysilicon thin-film transistor array substrate and a method for preparing the same, and a display device, wherein the method comprises a step of forming a gate electrode, a gate insulating layer, a semiconductor layer, a source electrode and a drain electrode of the polysilicon thin-film transistor, and a first electrode and a second electrode of a storage capacitor, and a gate line and a data line, wherein, the semiconductor layer and the first electrode of the storage capacitor are formed via a one-time patterning process, and the gate electrode, the gate line and the second electrode of the storage capacitor are formed via a one-time patterning process. By the solution of the invention, the number of mask plates used can be lowered, so that the process can be simplified, and the production cost can be lowered.

16 Claims, 6 Drawing Sheets

| (51) | Int. Cl. | |
|---|---|---|
| | *H01L 29/423* | (2006.01) |
| | *H01L 21/31* | (2006.01) |
| | *H01L 21/308* | (2006.01) |
| | *H01L 21/311* | (2006.01) |
| | *H01L 21/324* | (2006.01) |
| | *H01L 21/3213* | (2006.01) |
| | *H01L 29/04* | (2006.01) |
| | *H01L 27/12* | (2006.01) |
| | *H01L 49/02* | (2006.01) |
| | *H01L 21/02* | (2006.01) |

(56) References Cited

U.S. PATENT DOCUMENTS

| 7,659,578 | B2 | 2/2010 | Kang | |
|---|---|---|---|---|
| 7,830,476 | B2* | 11/2010 | Park | H01L 27/1214 |
| | | | | 257/59 |
| 2003/0224570 | A1* | 12/2003 | Shih | H01L 27/1255 |
| | | | | 438/253 |
| 2005/0285197 | A1* | 12/2005 | Park | H01L 29/4908 |
| | | | | 257/347 |

* cited by examiner

POLYSILICON THIN-FILM TRANSISTOR ARRAY SUBSTRATE AND METHOD FOR PREPARING THE SAME, AND DISPLAY DEVICE

CROSS-REFERENCE TO RELATED APPLICATION

The present application claims priority to and incorporates by reference the entire contents of Chinese priority document 201410345316.4, filed in China on Jul. 18, 2014.

TECHNICAL FIELD

The present invention relates to the field of display technologies, and in particular, to a polysilicon thin-film transistor array substrate and a method for preparing the same, and a display device.

BACKGROUND

In a flat display, for example, a liquid crystal display (LCD), an organic electroluminescent display or an inorganic electroluminescent display, a thin-film transistor (TFT) is generally used as a switch element to control the working of a pixel or as a driving element to drive a pixel. According to the property of the silicon thin film thereof, the thin-film transistor may usually be divided into amorphous silicon (a-Si) and polysilicon (poly-Si). In comparison with the amorphous silicon thin-film transistor, the polysilicon thin-film transistor has higher electron mobility, better liquid crystal features and smaller leakage current. Thus, a display made of polysilicon thin-film transistors will have a higher resolution and a faster response speed. The low-temperature polysilicon technology is gradually replacing the amorphous silicon technology and becoming a main stream of the research and development of thin-film transistors.

However, a process for preparing a polysilicon thin-film transistor array substrate has many disadvantages; for example, the process is complex, and the cost is high, etc. A typical polysilicon thin-film transistor array substrate employs a mask plate for 9 times, which is more complex and time-consuming in comparison with the general amorphous silicon thin-film transistor array substrate that employs a mask plate for 5 or 6 times, thus the capacity of industrialized production is lowered greatly, and the cost is increased.

SUMMARY

In view of this, the invention provides a polysilicon thin-film transistor array substrate and a method for preparing the same, and a display device, thereby solving the problems of the prior art that the process of a polysilicon thin-film transistor array substrate is complex and the cost is high.

In order to solve the above technical problems, one embodiment of the invention provides a method for preparing a polysilicon thin-film transistor array substrate, which comprises a step of forming a gate electrode, a gate insulating layer, a semiconductor layer, a source electrode and a drain electrode of the polysilicon thin-film transistor, and a first electrode and a second electrode of a storage capacitor, and a gate line and a data line, wherein, the semiconductor layer and the first electrode of the storage capacitor are formed via a one-time patterning process; and the gate electrode, the gate line and the second electrode of the storage capacitor are formed via a one-time patterning process.

In one embodiment, the step of forming a gate electrode, a gate insulating layer, a semiconductor layer, a source electrode and a drain electrode of the polysilicon thin-film transistor, and a first electrode and a second electrode of a storage capacitor, and a gate line and a data line specifically comprises:

forming the semiconductor layer and the first electrode of the storage capacitor via a one-time patterning process;

forming a gate insulating layer on the semiconductor layer and the first electrode of the storage capacitor;

forming the gate electrode, the gate line and the second electrode of the storage capacitor on the gate insulating layer via a one-time patterning process;

forming a second insulating layer on the gate electrode, the gate line and the second electrode of the storage capacitor, and forming a via hole that passes through the gate insulating layer and the second insulating layer; and forming the source electrode, the drain electrode and the data line on the second insulating layer via a one-time patterning process, wherein the source electrode and the drain electrode contact the semiconductor layer by the via hole.

In one embodiment, the step of forming the semiconductor layer and the first electrode of the storage capacitor via a one-time patterning process specifically comprises:

forming a polysilicon semiconductor film;

forming a first insulating film on the polysilicon semiconductor film;

coating a photoresist on the first insulating film;

exposing and developing the photoresist via a graytone or halftone mask plate to form a photoresist completely-reserved region, a photoresist half-reserved region and a photoresist completely-removed region, wherein, the photoresist completely-reserved region corresponds to the region of the semiconductor layer, the photoresist half-reserved region corresponds to the region of the storage capacitor, and the photoresist completely-removed region corresponds to other regions;

removing the polysilicon semiconductor film and the first insulating film in the photoresist completely-removed region via an etching process;

removing the photoresist in the photoresist half-reserved region via an ashing process;

removing the first insulating film in the photoresist half-reserved region via an etching process to form the pattern of a first insulating layer; and performing ion doping by taking the first insulating film above the region of the semiconductor layer as a mask, and performing an annealing process to make the polysilicon semiconductor film in the region of the storage capacitor as a conductor and form a first electrode of the storage capacitor, wherein the polysilicon semiconductor film in the region of the semiconductor layer is protected by the first insulating film thereon, so the polysilicon semiconductor film in the region of the semiconductor layer is still a semiconductor.

In one embodiment, the step of forming a polysilicon semiconductor film comprises:

forming an amorphous silicon semiconductor film;

performing an annealing process on the amorphous silicon semiconductor film, and removing the hydrogen atoms in the amorphous silicon semiconductor film; and performing an excimer laser annealing process on the amorphous silicon semiconductor film from which the hydrogen atoms have been removed, to form the polysilicon semiconductor film.

In one embodiment, the step of forming the gate electrode, the gate line and the second electrode of the storage capacitor via a one-time patterning process specifically comprises:

forming a gate metal film;

coating a photoresist on the gate metal film;

forming a photoresist completely-reserved region corresponding to the gate electrode region, the gate line region and the region of the storage capacitor and a photoresist completely-removed region corresponding to other regions, after exposing and developing the photoresist;

removing the gate metal film in the photoresist completely-removed region via an etching process; and peeling off the photoresist in the photoresist completely-reserved region to form the gate electrode, the gate line and the second electrode of the storage capacitor.

In one embodiment, the gate electrode is located above the region of the semiconductor layer, and the size thereof is smaller than the size of the polysilicon semiconductor film in the region of the semiconductor layer;

after the step of forming the gate electrode, the gate line and the storage capacitor via a one-time patterning process, the method further comprises:

performing ion doping by taking the gate electrode and the gate line as a mask and performing an annealing process, so as to make a region of the polysilicon semiconductor film in the region of the semiconductor layer that is exposed to the gate electrode become a conductor and form a contact conductor, and make a region of the polysilicon semiconductor film in the region of the semiconductor layer under the gate electrode still a semiconductor and form the semiconductor layer, wherein the source electrode and the drain electrode contact the semiconductor layer via the contact conductor.

In one embodiment, after the step of forming the source electrode, the drain electrode and the data line via a one-time patterning process, the method further comprises:

forming a third insulating layer on the source electrode, the drain electrode and the data line, and forming a via hole on the third insulating layer;

forming a pixel electrode on the third insulating layer via a one-time patterning process, wherein the pixel electrode contacts the drain electrode by the via hole on the third insulating layer.

In one embodiment, before the step of forming the semiconductor layer and the first electrode of the storage capacitor via a one-time patterning process, the method further comprises:

providing a base substrate; and forming a buffer layer on the base substrate;

wherein, the semiconductor layer and the first electrode of the storage capacitor are formed on the buffer layer via a one-time patterning process.

One embodiment of the invention further provides a polysilicon thin-film transistor array substrate, comprising: a gate electrode, a gate insulating layer, a semiconductor layer, a source electrode and a drain electrode of a polysilicon thin-film transistor, and a first electrode and a second electrode of a storage capacitor, and a gate line and a data line, wherein, the semiconductor layer and the first electrode of the storage capacitor are set on the same layer and are formed via a one-time patterning process; and the gate electrode, the gate line and the second electrode of the storage capacitor are set on the same layer and are formed via a one-time patterning process.

In one embodiment, the polysilicon thin-film transistor array substrate specifically comprises:

a semiconductor layer, and a first electrode of a storage capacitor, which are set on the same layer;

a first insulating layer, which is located above the semiconductor layer;

a gate insulating layer, which covers the semiconductor layer, the first electrode of the storage capacitor and the first insulating layer;

a gate electrode, a gate line, and a second electrode of the storage capacitor that are set on the same layer and located above the gate insulating layer;

a second insulating layer, which covers the gate electrode, the gate line and the top electrode of the storage capacitor;

a source electrode, a drain electrode and a data line that are set on the same layer and located above the second insulating layer, wherein the source electrode and the drain electrode contact the semiconductor layer by a via hole that passes through the gate insulating layer and the second insulating layer;

a third insulating layer, which covers the source electrode, the drain electrode and the data line; and a pixel electrode, which is located above the third insulating layer and contacts the drain electrode by a via hole that passes through the third insulating layer.

In one embodiment, the polysilicon thin-film transistor array substrate further comprises:

a base substrate;

a buffer layer, which is located above the base substrate, wherein, the semiconductor layer and the first electrode of the storage capacitor are located above the buffer layer.

One embodiment of the invention further provides a display device, which comprises the above polysilicon thin-film transistor array substrate.

The above technical solutions of the invention have the following beneficial effects:

the semiconductor layer of the polysilicon thin-film transistor and the first electrode of the storage capacitor are formed via a one-time patterning process, and the gate electrode and the gate line of the polysilicon thin-film transistor and the second electrode of the storage capacitor are formed via a one-time patterning process, thus the number of mask plates used can be lowered, so that the process can be simplified, and the production cost can be lowered.

DETAILED DESCRIPTION

In order to make the technical problems to be solved, the technical solutions and the advantages of the invention more apparent, a detailed description will be given below in conjunction with the drawings and specific embodiments.

One embodiment of the invention provides a method for preparing a polysilicon thin-film transistor array substrate, which includes: a step of forming a gate electrode, a gate insulating layer, a semiconductor layer, a source electrode and a drain electrode of the polysilicon thin-film transistor, and a first electrode and a second electrode of a storage capacitor, and a gate line and a data line, wherein, forming the semiconductor layer and the first electrode of the storage capacitor via a one-time patterning process; and forming the gate electrode, the gate line and the second electrode of the storage capacitor via a one-time patterning process.

Because the semiconductor layer and the first electrode of the storage capacitor are formed via a one-time patterning process and the gate electrode, the gate line and the second electrode of the storage capacitor are formed via a one-time patterning process, the number of mask plates used can be lowered, so that the process can be simplified, and the production cost can be lowered.

The polysilicon thin-film transistor formed in the above embodiment may be a thin-film transistor with a top-gate structure, or it may be a thin-film transistor with a bottom-gate structure.

Figure 1:
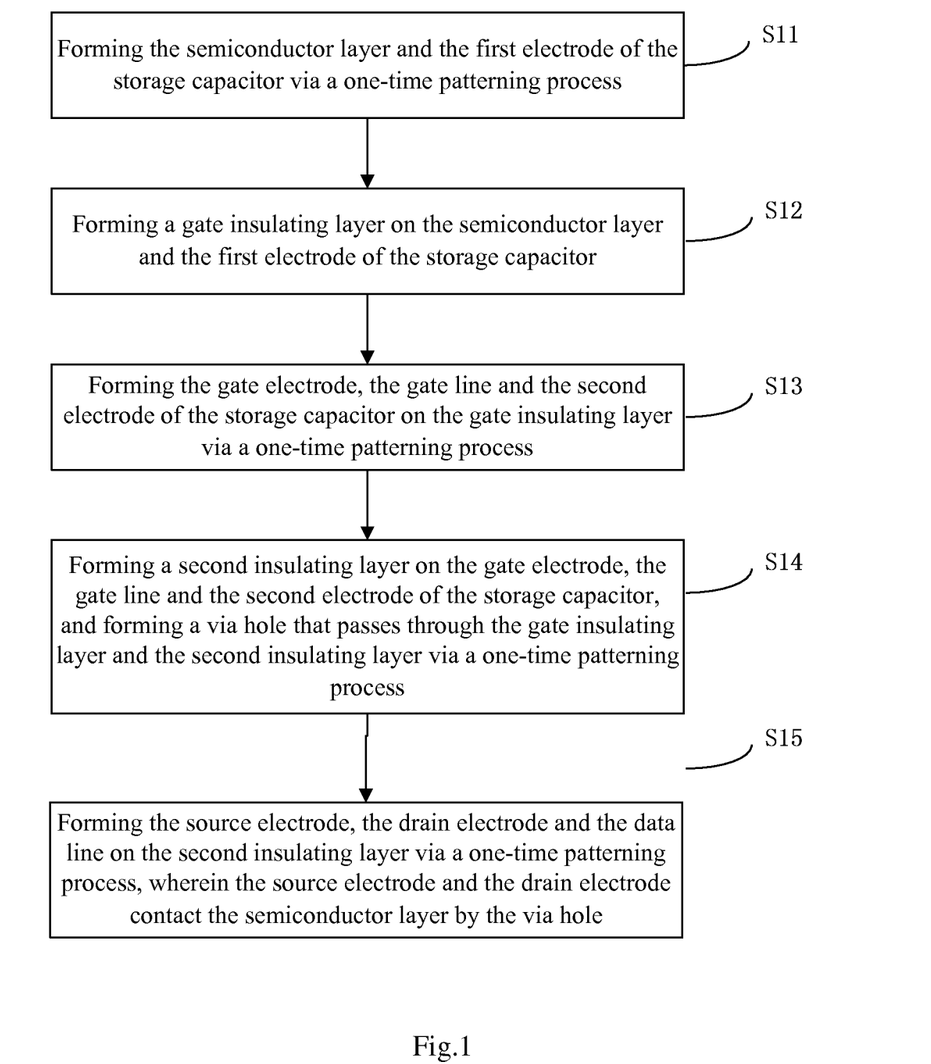
FIG. 1 is a schematic diagram of a method for preparing a polysilicon thin-film transistor array substrate according to Embodiment 1 of the invention.

Referring to FIG. 1, it shows a schematic diagram of a method for preparing a polysilicon thin-film transistor array substrate according to Embodiment 1 of the invention.

When the polysilicon thin-film transistor is a thin-film transistor with a top-gate structure, the method for preparing a polysilicon thin-film transistor array substrate includes: a step of forming a gate electrode, a gate insulating layer, a semiconductor layer, a source electrode and a drain electrode of the polysilicon thin-film transistor, and a first electrode and a second electrode of a storage capacitor, and a gate line and a data line, wherein the step specifically comprises:

Step S11: forming the semiconductor layer and the first electrode of the storage capacitor via a one-time patterning process;

The semiconductor layer and the first electrode of the storage capacitor formed are set on the same layer.

Step S12: forming a gate insulating layer on the semiconductor layer and the first electrode of the storage capacitor;

Step S13: forming the gate electrode, the gate line and the second electrode of the storage capacitor on the gate insulating layer via a one-time patterning process;

The gate electrode, the gate line and the second electrode of the storage capacitor; the second electrode of the storage capacitor is located above the first electrode of the storage capacitor, and the size of the second electrode is the same as the size of the first electrode.

Step S14: forming a second insulating layer on the gate electrode, the gate line and the second electrode of the storage capacitor, and forming a via hole that passes through the gate insulating layer and the second insulating layer via a one-time patterning process to expose the semiconductor layer;

Step S15: forming the source electrode, the drain electrode and the data line on the second insulating layer via a one-time patterning process, wherein the source electrode and the drain electrode contact the semiconductor layer by the via hole.

Because the polysilicon thin-film transistor formed is a thin-film transistor with a top-gate structure, the first electrode of the storage capacitor in the above embodiment is a bottom electrode of the storage capacitor, and the second electrode of the storage capacitor is a top electrode of the storage capacitor.

Figure 2:
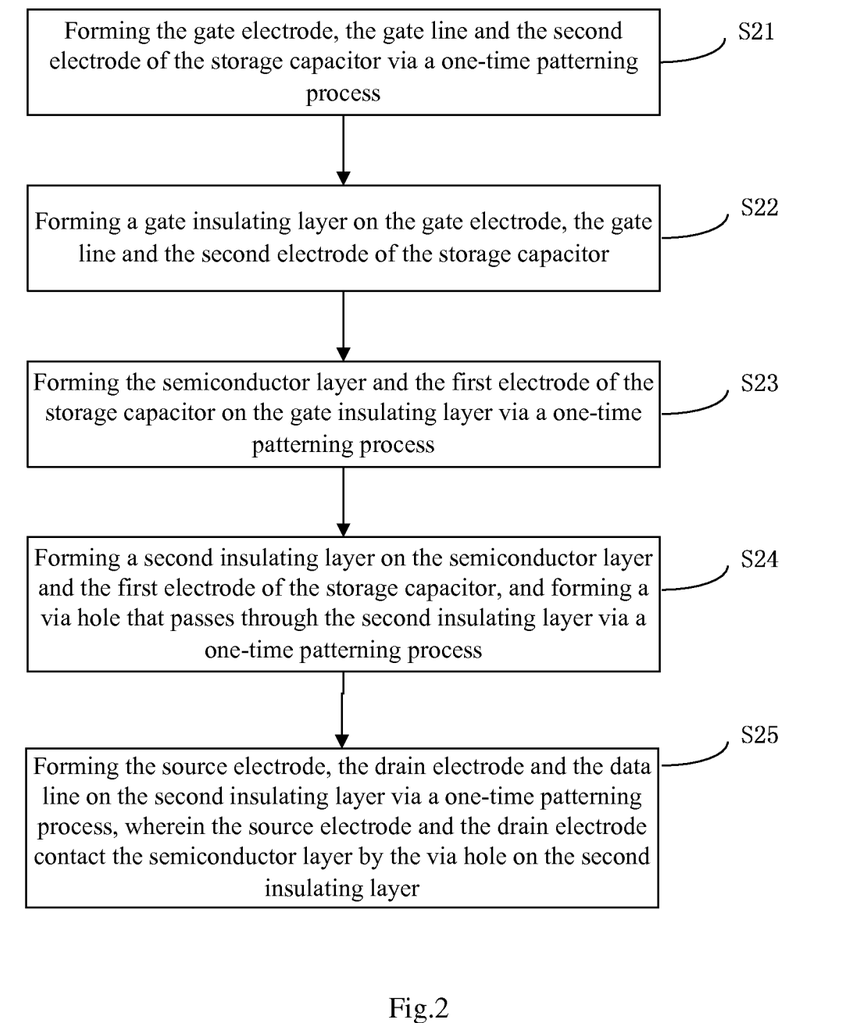
FIG. 2 is a schematic diagram of a method for preparing a polysilicon thin-film transistor array substrate according to Embodiment 2 of the invention.

Referring to FIG. 2, it shows a schematic diagram of a method for preparing a polysilicon thin-film transistor array substrate according to Embodiment 2 of the invention.

When the polysilicon thin-film transistor is a thin-film transistor with a bottom-gate structure, the method for preparing a polysilicon thin-film transistor array substrate includes: a step of forming a gate electrode, a gate insulating layer, a semiconductor layer, a source electrode and a drain electrode of the polysilicon thin-film transistor, and a first electrode and a second electrode of a storage capacitor, and a gate line and a data line, wherein the step specifically comprises:

Step S21: forming the gate electrode, the gate line and the second electrode of the storage capacitor via a one-time patterning process;

The gate electrode, the gate line and the second electrode of the storage capacitor are set on the same layer.

Step S22: forming the gate insulating layer on the gate electrode, the gate line and the second electrode of the storage capacitor;

Step S23: forming the semiconductor layer and the first electrode of the storage capacitor on the gate insulating layer via a one-time patterning process;

The semiconductor layer and the first electrode of the storage capacitor formed are set on the same layer. The first electrode of the storage capacitor is located above the second electrode of the storage capacitor, and the size of the first electrode is the same as the size of the second electrode.

Step S24: forming a second insulating layer on the semiconductor layer and the first electrode of the storage capacitor, and forming a via hole that passes through the second insulating layer via a one-time patterning process to expose the semiconductor layer;

Step S25: forming the source electrode, the drain electrode and the data line on the second insulating layer via a one-time patterning process, wherein the source electrode and the drain electrode contact the semiconductor layer by the via hole on the second insulating layer.

Because the polysilicon thin-film transistor formed is a thin-film transistor with a bottom-gate structure, the first electrode of the storage capacitor in the above embodiment is a top electrode of the storage capacitor, and the second electrode of the storage capacitor is a bottom electrode of the storage capacitor.

In the above embodiment, plasma-enhanced chemical vapor deposition (PECVD) may be employed to form a gate insulating layer, and the thickness of the gate insulating layer formed may be 1000 Å-2000 Å, and the material may be a single-layer film of SiNx (silicon nitride) or a composite of SiNx and SiOx (silicon oxide).

In the above embodiment, PECVD may be employed to form a second insulating layer, and the thickness of the second insulating layer formed may be 1000 Å-3000 Å, and the material may be SiNx, SiOx, or a composite of SiNx and SiOx, etc.

The step of forming the via hole may include: exposing and developing the second insulating layer, and then performing an etching process (specifically, a dry etching process) to form a via hole for the source electrode and the drain electrode to contact the semiconductor layer.

The step of forming the source electrode, the drain electrode and the data line on the second insulating layer via a one-time patterning process may include: depositing a source-drain metal film via sputtering or thermal evaporation, wherein the thickness of the source-drain metal film deposited may be 2000 Å-3000 Å, and the material may be a metal such as Mo, Al, Cu and W, etc., or a composite film of the above metals, and then forming the patterns of the source electrode, the drain electrode and the data line after exposing, developing and etching.

Because a low-temperature polysilicon thin-film transistor is usually a thin-film transistor with a top-gate structure, in the embodiments below, illustration will be given by taking a thin-film transistor with a top-gate structure as an example.

In the above embodiment, when the semiconductor layer and the first electrode of the storage capacitor are formed, an ion doping process is required. In the prior art, when an ion doping process is performed, a photoresist needs to be used as a mask. The ions doped tends to cause the curing of the photoresist, thus photoresist residual may be caused, and the next process may be influenced, which causes a low qualification rate of the polysilicon thin-film transistor array substrate.

In order to solve the above problem of low product qualification rate caused by the photoresist in the ion doping process, in the embodiments of the invention, no photoresist is used as a mask during the ion doping process; instead, an insulating layer film is employed to replace the photoresist so as to increase the product yield.

Specifically, the step of forming the semiconductor layer and the first electrode of the storage capacitor via a one-time patterning process may include:

forming a polysilicon semiconductor film;

forming a first insulating film on the polysilicon semiconductor film;

coating a photoresist on the first insulating film;

exposing and developing the photoresist via a graytone or halftone mask plate to form a photoresist completely-reserved region, a photoresist half-reserved region and a photoresist completely-removed region, wherein, the photoresist completely-reserved region corresponds to the region of the semiconductor layer, the photoresist half-reserved region corresponds to the region of the storage capacitor, and the photoresist completely-removed region corresponds to other regions;

removing the polysilicon semiconductor film and the first insulating film in the photoresist completely-removed region via an etching process;

removing the photoresist in the photoresist half-reserved region via an ashing process;

removing the first insulating film in the photoresist half-reserved region via an etching process to form the pattern of a first insulating layer; and performing ion doping by taking the first insulating film above the region of the semiconductor layer as a mask, and performing an annealing process to make the polysilicon semiconductor film in the region of the storage capacitor as a conductor and form a first electrode of the storage capacitor, wherein the polysilicon semiconductor film in the region of the semiconductor layer is protected by the first insulating film thereon, so the polysilicon semiconductor film in the region of the semiconductor layer is still a semiconductor.

In this embodiment, plasma-enhanced chemical vapor deposition (PECVD) may be employed to form the first insulating film, the material of the first insulating film may be SiOx, and the thickness may be 500 Å-1000 Å.

A dry etching process may be employed to remove the polysilicon semiconductor film and the first insulating film in the photoresist completely-removed region.

A dry etching process may be employed to remove the first insulating film in the photoresist half-reserved region.

In the ion doping process of this embodiment, the ions doped may be boron ions, the reacting gas may be B2H6 (borane), the concentration may be 10%, and the ion accelerating voltage may be 10-50 KV (kilovolt).

In this embodiment, no photoresist is used as a mask during the ion doping process, instead, an insulating film layer is employed to replace the photoresist, thus the product yield may be increased effectively.

In addition, in this embodiment, the photoresist is exposed and developed via a graytone or halftone mask plate, thus the number of process mask plates may be effectively reduced, thereby the process time may be shortened, and the production efficiency may be increased.

The polysilicon semiconductor film in the above embodiment may be transformed from a monocrystalline semiconductor layer, specifically, the step of forming a polysilicon semiconductor film may include:

forming an amorphous silicon semiconductor film;

performing an annealing process (RTA) on the amorphous silicon semiconductor film, and removing the hydrogen atoms in the amorphous silicon semiconductor film;

performing an excimer laser annealing process (ELA) on the amorphous silicon semiconductor film from which the hydrogen atoms have been removed, to form the polysilicon semiconductor film.

Wherein, an amorphous silicon semiconductor film may be formed in a deposition mode, the thickness of the amorphous silicon semiconductor film formed may be 300 Å-1000 Å, and the corresponding reacting gas may be a mixed gas of SiH4 (silicane) and H2 (hydrogen gas) or a mixed gas of SiH2Cl2 (dichlorosilane) and H2 (hydrogen gas).

In the above embodiment, the step of forming the gate electrode, the gate line and the second electrode of the storage capacitor via a one-time patterning process may include:

forming a gate metal film;

coating a photoresist on the gate metal film;

forming a photoresist completely-reserved region corresponding to the gate electrode region, the gate line region and the region of the storage capacitor and a photoresist completely-removed region corresponding to other regions after exposing and developing the photoresist;

removing the gate metal film in the photoresist completely-removed region via an etching process; and peeling off the photoresist in the photoresist completely-reserved region to form the gate electrode, the gate line and the second electrode of the storage capacitor.

In the above steps, sputtering may be employed to deposit and form the gate metal film, and the thickness of the gate metal film formed may be 1500 Å-2500 Å, and the material may be a metal such as Mo (molybdenum), Al (aluminium), Cu (copper) and W (tungsten), etc., or a composite film of the above metals.

In the above steps, an ordinary mask plate is used to expose the photoresist. The gate metal film in the photoresist completely-removed region is removed via a wet etching process.

The gate electrode formed in the above embodiment is located above the region of the semiconductor layer, and the size thereof may be smaller than the size of the polysilicon semiconductor film in the region of the semiconductor layer; at this time, after the step of forming the gate electrode, the gate line and the storage capacitor via a one-time patterning process, the method further includes:

performing ion doping by taking the gate electrode and the gate line as a mask and performing an annealing process, so as to make a region of the polysilicon semiconductor film in the region of the semiconductor layer that is exposed to the gate electrode become a conductor and form a contact conductor, and make a region of the polysilicon semiconductor film in the region of the semiconductor layer under the gate electrode still a semiconductor and form the semiconductor layer, wherein the source electrode and the drain electrode contact the semiconductor layer via the contact conductor.

The ions doped via an ion doping process in this step may be boron ions, the reacting gas may be B2H6, the concentration may be 10%, and the ion accelerating voltage may be 50-100 KV (kilovolt).

In this embodiment, no photoresist is used as a mask during the ion doping process, instead, a gate electrode and a gate line are employed to replace the photoresist, thus the product yield may be further increased. In addition, a contact conductor is formed in this embodiment, so that the semiconductor layer may contact the source electrode and the drain electrode formed subsequently via the contact conductor, thereby the contact resistance between the source electrode, the drain electrode and the semiconductor layer may be reduced.

However, in some other embodiments of the invention, this ion doping process may not be performed.

In the above embodiment, after the step of forming the source electrode, the drain electrode and the data line via a one-time patterning process, the method may further include:

forming a third insulating layer on the source electrode, the drain electrode and the data line, and forming a via hole that passes through the third insulating layer;

forming a pixel electrode on the third insulating layer via a one-time patterning process, wherein the pixel electrode contacts the drain electrode by the via hole on the third insulating layer.

The step of forming a third insulating layer on the source electrode, the drain electrode and the data line and forming a via hole on the third insulating layer may include: first, forming a third insulating layer via PECVD, wherein the thickness of the third insulating layer formed may be 1000 Å-3000 Å, and the material may be SiNx, SiOx or a composite of SiNx and SiOx, etc.; then, performing a exposing, developing and etching process (specifically, dry etching may be employed); and finally, forming a via hole for the drain electrode to contact the pixel electrode on the third insulating layer.

The third insulating layer may also be made of an insulating resin material.

The step of forming a pixel electrode on the third insulating layer via a one-time patterning process may include: depositing a layer of transparent conducting film via a magnetron sputtering device (Sputter), wherein the material may be tin indium oxide (ITO), zinc indium oxide (IZO) or zinc aluminium oxide, etc., and the thickness may be 500 Å-1500 Å; then, performing an exposing process via an ordinary mask plate, and forming the pixel electrode after developing and wet etching.

In addition, before the step of forming the semiconductor layer and the first electrode of the storage capacitor via a one-time patterning process, the method may further comprises:

providing a base substrate; and forming a buffer layer (Buffer) on the base substrate; wherein, the semiconductor layer and the first electrode of the storage capacitor are formed on the buffer layer via a one-time patterning process.

The base substrate may be a glass substrate or a substrate of other materials.

In one embodiment, PECVD may be used to deposit the buffer layer. The thickness of the buffer layer may be 2000 Å-3000 Å, and the material may be a single-layer film of SiOx or a composite of SiNx (silicon nitride) and SiOx, and the corresponding reacting gas may be a mixed gas of SiH4, NH3 (ammonia gas) and N2 (nitrogen gas) or a mixed gas of SiH2Cl2, NH3 and N2.

Referring to FIGS. 3A-3J, FIGS. 3A-3J show a schematic diagram of a method for preparing a polysilicon thin-film transistor array substrate according to Embodiment 3 of the invention.

The method includes the steps 3A-3J as follows.

Figure 3A:
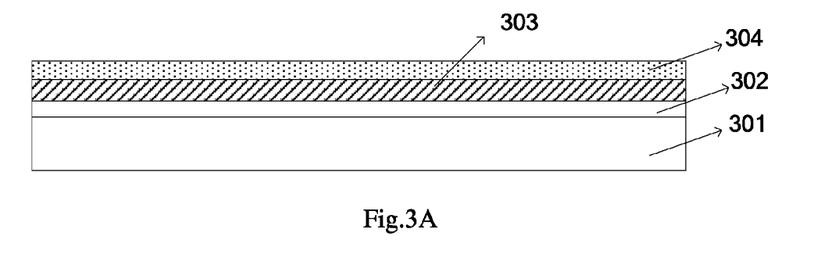
FIGS. 3A-3J show a schematic diagram of a method for preparing a polysilicon thin-film transistor array substrate according to Embodiment 3 of the invention.

Step 3A:

A buffer layer 302 is deposited on a glass substrate 301 via PECVD, the thickness is 2000 Å-3000 Å, the material may be a single-layer film of SiOx or a composite of SiNx and SiOx, and the corresponding reacting gas may be a mixed gas of SiH4, NH3 and N2 or a mixed gas of SiH2Cl2, NH3 and N2;

Next, a layer of amorphous silicon semiconductor film is deposited, the thickness is 300 Å-1000 Å, and the corresponding reacting gas may be a mixed gas of SiH4 and H2 or a mixed gas of SiH2Cl2 and H2;

A rapid thermal annealing (RTA) process is performed on the glass substrate 301 on which the above film has been deposited, and the hydrogen gas in the A-Si is removed, then an excimer laser annealing (ELA) process is performed to make the amorphous silicon semiconductor film become a polysilicon semiconductor film 303;

After the above processes, a player of first insulating film 304 is deposited via PECVD, the material may be SiOx, and the thickness is 500 Å-1000 Å.

Figure 3B:
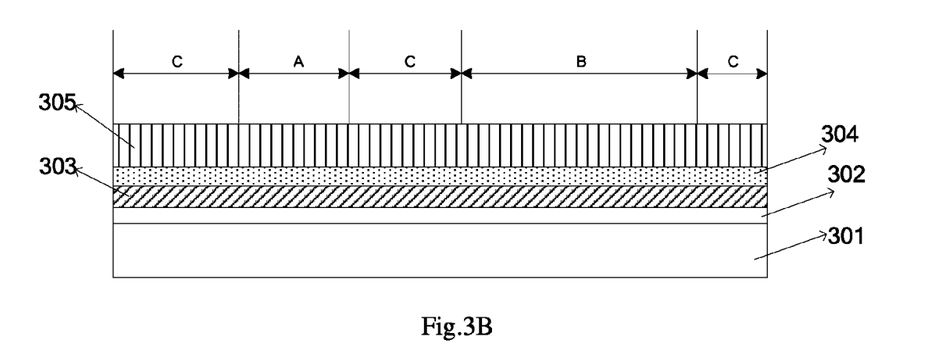
Figure 3C:
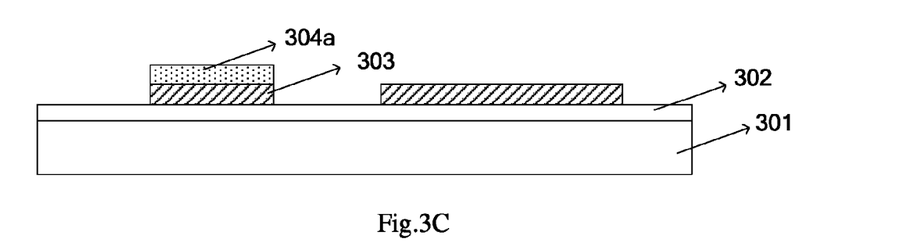

Step 3B:

A layer of photoresist 305 is coated on the first insulating film 304, and the photoresist 305 is exposed and developed via a graytone or halftone mask plate to form a photoresist completely-reserved region A, a photoresist half-reserved region B and a photoresist completely-removed region C, wherein the photoresist completely-reserved region A corresponds to the semiconductor layer region, the photoresist half-reserved region B corresponds to the region of the storage capacitor, and the photoresist completely-removed region C corresponds to other regions;

Step 3C:

The first insulating film 304 and the polysilicon semiconductor film 303 in the photoresist completely-removed region C are etched via a dry etching process;

Then, the photoresist is ashed once, and the photoresist 305 in the photoresist half-reserved region B is removed, then dry etching is performed once to remove the first insulating film 304 on the polysilicon semiconductor film 303 in the region of the storage capacitor, thus the pattern of a first insulating layer 304a is formed.

Figure 3D:
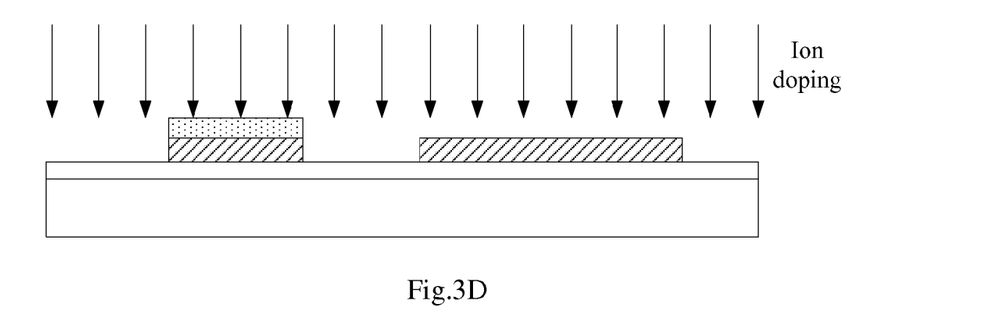
Figure 3E:
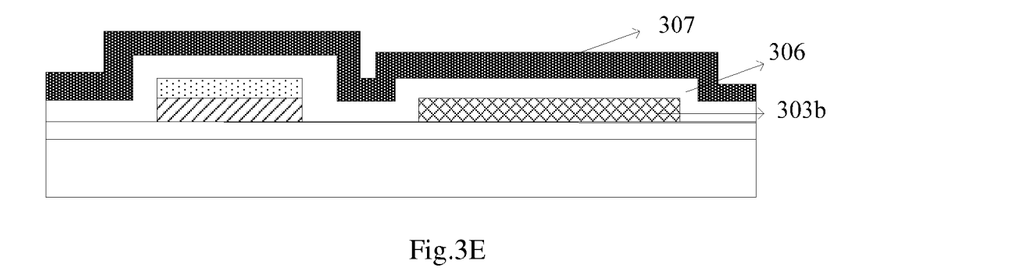

Step 3D:

The substrate is put into an ion doping device, and an ion doping process is performed by taking the first insulating layer 304a on the polysilicon semiconductor film 303 in the semiconductor layer region as a mask plate, wherein the ions doped are boron ions, the reacting gas is B2H6, the concentration is 10%, and the ion accelerating voltage may be 10-50 KV (kilovolt); and an annealing process is performed to make the polysilicon semiconductor film 303 in the region of the storage capacitor become a conductor, so that a bottom electrode 303b of the storage capacitor is formed (see FIG. 3E).

Step 3E:

A gate insulating layer 306 is deposited via PECVD, the thickness is 1000 Å-2000 Å, and the material may be a single-layer film of SiNx or a composite of SiNx and SiOx;

A layer of gate metal film 307 is deposited via a Sputter, the thickness is 1500 Å-2500 Å, and the material may be a metal such as Mo, Al, Cu and W, etc., or a composite film of the above metals.

Figure 3F:
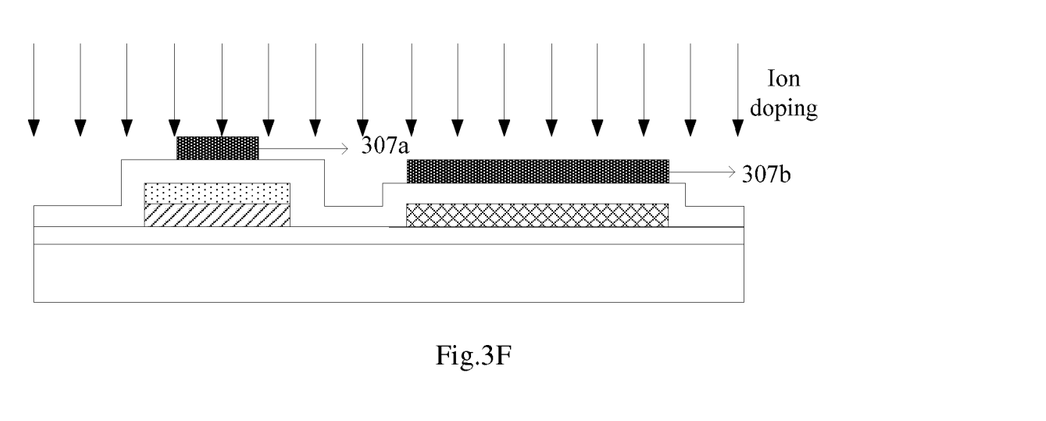

Step 3F:

A photoresist is coated on the gate metal film 307, an exposing process is performed via an ordinary mask plate, then wet etching is performed, and finally a gate electrode 307a, a gate line (not shown) and a top electrode 307b of the storage capacitor are formed.

Figure 3G:
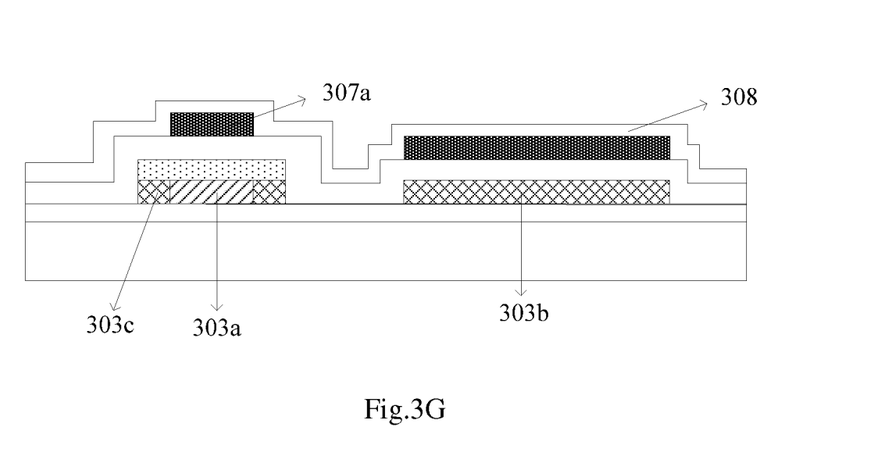

The above formed substrate is again put into an ion doping device, and an ion doping process is performed by taking the gate electrode 307a and the gate line as a mask plate, wherein the ions doped are boron ions, the reacting gas is B2H6, the concentration is 10%, and the ion accelerating voltage may be 50-100 KV (kilovolt); and an annealing process is performed to make the part of the polysilicon semiconductor film 303 in the semiconductor layer region that exceeds the gate electrode 307a become a conductor and form a connecting conductor 303c (see FIG. 3G) so as to reduce the contact resistance between the source/drain electrode and the semiconductor layer, and the polysilicon semiconductor film 303 under the gate electrode 307a is still kept a semiconductor to form a semiconductor layer 303a (see FIG. 3G).

Step 3G:

A second insulating layer 308 is deposited via PECVD, the thickness is 1000 Å-3000 Å, and the material may be SiNx, SiOx, or a composite thereof, etc.

Figure 3H:
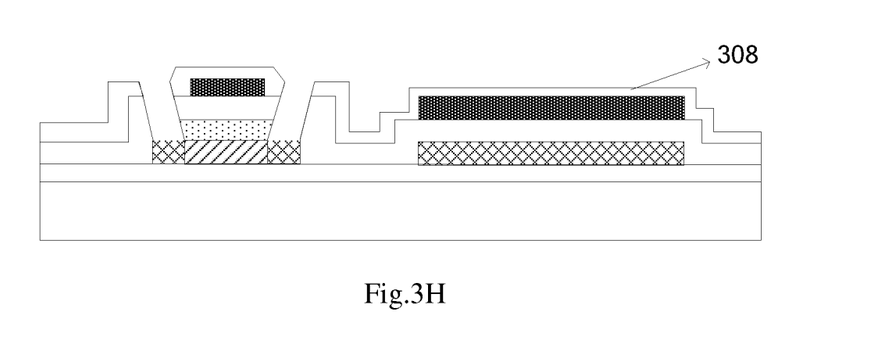

Step 3H:

The second insulating layer 308 is exposed and developed, then dry etching is performed to form a via hole on the second insulating layer 308 for the source and drain electrodes to contact the semiconductor layer 303a.

Figure 3I:
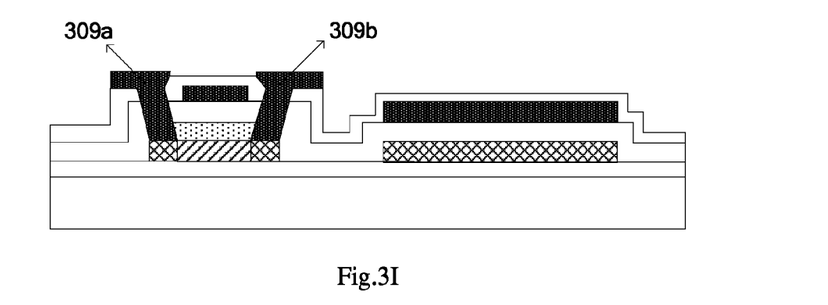

Step 3I:

Then, a source-drain metal film is deposited via sputtering or thermal evaporation, the thickness of the source-drain metal film is 2000 Å-3000 Å, and the material may be a metal such as Mo, Al, Cu and W, etc., or a composite film of the above metals, and after exposing, developing and etching, the patterns of a source electrode 309a, a drain electrode 309b and a data line (not shown) are formed.

Figure 3J:
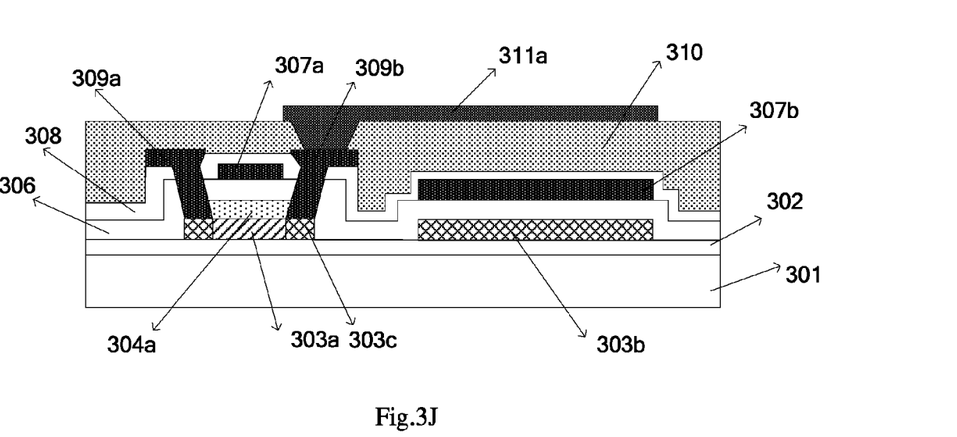

Step 3J:

A third insulating layer 310 is deposited via PECVD, wherein the thickness is 1000 Å-3000 Å, and the material is SiNx, SiOx or a composite thereof, and then the third insulating layer 310 is exposed and developed and a dry etching process is performed, and finally, a via hole for the drain electrode 309b to contact the pixel electrode formed subsequently is formed on the third insulating layer 310. The third insulating layer 310 may also be replaced by an insulating resin;

A layer of transparent conducting film is deposited via a magnetron sputtering device (Sputter), wherein the material may be a material such as tin indium oxide (ITO), zinc indium oxide (IZO) or zinc aluminium oxide, etc., and the thickness is 500 Å-1500 Å, and then an exposing process is performed via an ordinary mask plate, and after developing and wet etching, a pixel electrode 311a is formed.

Corresponding to the above preparation method, one embodiment of the invention further provides a polysilicon thin-film transistor array substrate, which includes: a gate electrode, a gate insulating layer, a semiconductor layer, a source electrode and a drain electrode of a polysilicon thin-film transistor, and a first electrode and a second electrode of a storage capacitor, and a gate line and a data line, wherein, the semiconductor layer and the first electrode of the storage capacitor are set on the same layer and are formed via a one-time patterning process; and the gate electrode, the gate line and the second electrode of the storage capacitor are set on the same layer and are formed via a one-time patterning process.

The polysilicon thin-film transistor formed in the above embodiment may be a thin-film transistor with a top-gate structure, or it may be a thin-film transistor with a bottom-gate structure.

When the polysilicon thin-film transistor is a thin-film transistor with a top-gate structure, the polysilicon thin-film transistor array substrate may specifically includes:

a semiconductor layer and a first electrode of a storage capacitor, which are set on the same layer;

a first insulating layer, which is located above the semiconductor layer;

a gate insulating layer, which covers the semiconductor layer, the first electrode of the storage capacitor and the first insulating layer (as shown in FIG. 3I);

a gate electrode, a gate line, and a second electrode of the storage capacitor, which are set on the same layer and located above the gate insulating layer;

a second insulating layer, which covers the gate electrode, the gate line and the top electrode of the storage capacitor; and a source electrode, a drain electrode and a data line that are set on the same layer and located above the second insulating layer, wherein the source electrode and the drain electrode contact the semiconductor layer by a via hole that passes through the gate insulating layer and the second insulating layer.

In one embodiment, a doping process is performed on the region in the semiconductor layer that contacts the source/drain electrode, so as to form an ohmic contact region between the source/drain electrode and a channel region.

When the polysilicon thin-film transistor is a thin-film transistor with a bottom-gate structure, the polysilicon thin-film transistor array substrate may specifically includes:

a gate electrode, a gate line, and a second electrode of the storage capacitor, which are set on the same layer;

a gate insulating layer, which covers the gate electrode, the gate line, and the second electrode of the storage capacitor;

a semiconductor layer, and a first electrode of a storage capacitor, which are set on the same layer and located above the gate insulating layer;

a first insulating layer, which is located above the semiconductor layer;

a second insulating layer, which covers the semiconductor layer, the first electrode of the storage capacitor and the first insulating layer;

a source electrode, a drain electrode and a data line that are set on the same layer and located above the second insulating layer, wherein the source electrode and the drain electrode contact the semiconductor layer via hole that passes through the second insulating layer;

a third insulating layer, which covers the source electrode, the drain electrode and the data line; and a pixel electrode, which is located above the third insulating layer and contacts the drain electrode by a via hole that passes through the third insulating layer.

In one embodiment, in the above embodiment, a doping process is performed on the region of the semiconductor layer that contacts the source/drain electrode.

In one embodiment, the polysilicon thin-film transistor array substrate further includes:

a base substrate; and a buffer layer, which is located above the base substrate, wherein, the semiconductor layer and the first electrode of the storage capacitor are located above the buffer layer.

The invention further provides a display device, which includes the polysilicon thin-film transistor array substrate according to the above embodiment. The display device may be any product or component that has a display function, such as, liquid crystal display panel, electronic paper, OLED panel, mobile phone, tablet computer, TV set, display, notebook computer, digital photo frame and navigator, etc.

The above descriptions only show some preferred embodiment of the invention. It should be pointed out that, various improvements and modifications may be further made by one of ordinary skills in the art without departing from the principle of the invention, and all these improvements and modifications should be construed as falling into the protection scope of the invention.

What is claimed is:

1. A method for preparing a polysilicon thin-film transistor array substrate, comprising: a step of forming (i) a gate electrode, a gate insulating layer, a semiconductor layer, a source electrode and a drain electrode of a polysilicon thin-film transistor, (ii) a first electrode and a second electrode of a storage capacitor, (iii) a gate line, and (iv) a data line, wherein:

the semiconductor layer and the first electrode of the storage capacitor are formed via a one-time patterning process; and the gate electrode, the gate line, and the second electrode of the storage capacitor are formed via a one-time patterning process; and forming the semiconductor layer and the first electrode of the storage capacitor comprises:

forming a polysilicon semiconductor film;

forming a first insulating film on the polysilicon semiconductor film;

coating a photoresist on the first insulating film;

exposing and developing the photoresist via a graytone or halftone mask plate to form a photoresist completely-reserved region, a photoresist half-reserved region and a photoresist completely-removed region, wherein the photoresist completely-reserved region corresponds to a semiconductor layer region, the photoresist half-reserved region corresponds to a storage capacitor region, and the photoresist completely-removed region corresponds to other regions;

removing the polysilicon semiconductor film and the first insulating film in the photoresist completely-removed region via an etching process;

removing the photoresist in the photoresist half-reserved region via an ashing process;

removing the first insulating film in the photoresist half-reserved region via an etching process to define a first insulating layer;

performing a first ion doping operation by taking the first insulating film above the semiconductor layer region as a first mask; and performing an annealing process to make the polysilicon semiconductor film in the storage capacitor region as a conductor and form a first electrode of the storage capacitor, wherein the polysilicon semiconductor film in the semiconductor layer region is protected by the first insulating film when performing the first ion doping operation, such that the polysilicon semiconductor film in the semiconductor layer region remains a semiconductor.

2. The method according to claim 1, wherein forming a polysilicon semiconductor film comprises:

forming an amorphous silicon semiconductor film;

performing an annealing process on the amorphous silicon semiconductor film, and removing hydrogen atoms in the amorphous silicon semiconductor film;

performing an excimer laser annealing process on the amorphous silicon semiconductor film, from which the hydrogen atoms have been removed, to form the polysilicon semiconductor film.

3. The method according to claim 1, wherein forming the gate electrode, the gate line, and the second electrode of the storage capacitor comprises:

forming a gate metal film;

coating a photoresist on the gate metal film;

exposing and developing the photoresist to form (i) a photoresist completely-reserved region corresponding to a gate electrode region, a gate line region, and the storage capacitor region, and (ii) a photoresist completely-removed region corresponding to other regions;

removing the gate metal film in the photoresist completely-removed region via an etching process; and peeling off the photoresist in the photoresist completely-reserved region to form the gate electrode, the gate line, and the second electrode of the storage capacitor.

4. The method according to claim 3, wherein:

the gate electrode is located above the semiconductor layer region;

a first size of the semiconductor layer is smaller than a second size of the polysilicon semiconductor film in the semiconductor layer region; and the method further comprises, after forming the gate electrode, the gate line, and the storage capacitor:

performing a second ion doping operation by taking the gate electrode and the gate line as a second mask and performing an annealing process, so as to (i) make a polysilicon semiconductor film region in the semiconductor layer region that is exposed to the gate electrode become a conductor and form a contact conductor, (ii) make a polysilicon semiconductor film in the semiconductor layer region under the gate electrode remain a semiconductor, and (iii) form the semiconductor layer, wherein the source electrode and the drain electrode contact the semiconductor layer via the contact conductor.

5. The method according to claim 4, wherein:

the first ion doping operation comprises doping with boron ions by using borane at a concentration of 10% as a reacting gas with an ion accelerating voltage of 10-50 kilovolts; and the second ion doping operation comprises doping with boron ions by using borane at a concentration of 10% as a reacting gas with an ion accelerating voltage of 50-100 kilovolts.

6. The method according to claim 1, wherein the first ion doping operation comprises doping with boron ions by using borane at a concentration of 10% as a reacting gas with an ion accelerating voltage of 10-50 kilovolts.

7. A method for preparing a polysilicon thin-film transistor array substrate including (i) a gate electrode, (ii) a gate insulating layer, (iii) a semiconductor layer, (iv) a source electrode and a drain electrode of a polysilicon thin-film transistor, (v) a first electrode and a second electrode of a storage capacitor, (vi) a gate line, and (vii) a data line, the method comprising:
  forming the semiconductor layer and the first electrode of the storage capacitor via a one-time patterning process;
  forming the gate insulating layer on the semiconductor layer and the first electrode of the storage capacitor;
  forming the gate electrode, the gate line, and the second electrode of the storage capacitor on the gate insulating layer via a one-time patterning process;
  forming a second insulating layer on the gate electrode, the gate line, and the second electrode of the storage capacitor, and forming a via hole that passes through the gate insulating layer and the second insulating layer; and
  forming the source electrode, the drain electrode, and the data line on the second insulating layer via a one-time patterning process,
  wherein the source electrode and the drain electrode contact the semiconductor layer by the via hole, and
  wherein forming the semiconductor layer and the first electrode of the storage capacitor comprises:
    forming a polysilicon semiconductor film;
    forming a first insulating film on the polysilicon semiconductor film;
    coating a photoresist on the first insulating film;
    exposing and developing the photoresist via a graytone or halftone mask plate to form a photoresist completely-reserved region, a photoresist half-reserved region, and a photoresist completely-removed region, wherein the photoresist completely-reserved region corresponds to a semiconductor layer region, the photoresist half-reserved region corresponds to a storage capacitor region, and the photoresist completely-removed region corresponds to other regions;
    removing the polysilicon semiconductor film and the first insulating film in the photoresist completely-removed region via an etching process;
    removing the photoresist in the photoresist half-reserved region via an ashing process;
    removing the first insulating film in the photoresist half-reserved region via an etching process to define a first insulating layer; and
    performing a first ion doping operation by taking the first insulating film above the semiconductor layer region as a first mask, and performing an annealing process to make the polysilicon semiconductor film in the storage capacitor region as a conductor and form a first electrode of the storage capacitor, wherein the polysilicon semiconductor film in the semiconductor layer region is protected by the first insulating film when performing the first ion doping operation, such that the polysilicon semiconductor film in the semiconductor layer region remains a semiconductor.

8. The method according to claim 7, wherein forming a polysilicon semiconductor film comprises:
  forming an amorphous silicon semiconductor film;
  performing an annealing process on the amorphous silicon semiconductor film, and removing hydrogen atoms in the amorphous silicon semiconductor film; and
  performing an excimer laser annealing process on the amorphous silicon semiconductor film, from which the hydrogen atoms have been removed, to form the polysilicon semiconductor film.

9. The method according to claim 7, wherein forming the gate electrode, the gate line, and the second electrode of the storage capacitor comprises:
  forming a gate metal film;
  coating a photoresist on the gate metal film;
  exposing and developing the photoresist to form (i) a photoresist completely-reserved region corresponding to a gate electrode region, a gate line region, and the storage capacitor region and (ii) a photoresist completely-removed region corresponding to other regions;
  removing the gate metal film in the photoresist completely-removed region via an etching process; and
  peeling off the photoresist in the photoresist completely-reserved region to form the gate electrode, the gate line, and the second electrode of the storage capacitor.

10. The method according to claim 9, wherein:
  the gate electrode is located above the semiconductor layer region, and a first size thereof is smaller than a second size of the polysilicon semiconductor film in the semiconductor layer region; and
  the method further comprises, after forming the gate electrode, the gate line, and the storage capacitor:
    performing a second ion doping operation by taking the gate electrode and the gate line as a second mask and performing an annealing process, so as to make a polysilicon semiconductor film region in the semiconductor layer region that is exposed to the gate electrode become a conductor and form a contact conductor, and make a polysilicon semiconductor film in the semiconductor layer region under the gate electrode remain a semiconductor and form the semiconductor layer,
    wherein the source electrode and the drain electrode contact the semiconductor layer via the contact conductor.

11. The method according to claim 10, wherein:
  the first ion doping operation comprises doping with boron ions by using borane at a concentration of 10% as a reacting gas with an ion accelerating voltage of 10-50 kilovolts; and
  the second ion doping operation comprises doping with boron ions by using borane at a concentration of 10% as a reacting gas with an ion accelerating voltage of 50-100 kilovolts.

12. The method according to claim 7, wherein the method further comprises, after forming the source electrode, the drain electrode, and the data line:
  forming a third insulating layer on the source electrode, the drain electrode, and the data line, and forming a via hole on the third insulating layer; and
  forming a pixel electrode on the third insulating layer via a one-time patterning process, wherein the pixel electrode contacts the drain electrode by the via hole on the third insulating layer.

13. The method according to claim 7, wherein the method further comprises, before forming the semiconductor layer and the first electrode of the storage capacitor:

providing a base substrate; and forming a buffer layer on the base substrate, wherein the semiconductor layer and the first electrode of the storage capacitor are formed on the buffer layer via a one-time patterning process.

14. The method according to claim 7, wherein the first ion doping operation comprises doping with boron ions by using borane at a concentration of 10% as a reacting gas with an ion accelerating voltage of 10-50 kilovolts.

15. A method for preparing a polysilicon thin-film transistor array substrate including (i) a gate electrode, (ii) a gate insulating layer, (iii) a semiconductor layer, (iv) a source electrode and a drain electrode of a polysilicon thin-film transistor, (v) a first electrode and a second electrode of a storage capacitor, (vi) a gate line, and (vii) a data line, the method comprising:

forming the gate electrode, the gate line, and the second electrode of the storage capacitor via a one-time patterning process;

forming the gate insulating layer on the gate electrode, the gate line and the second electrode of the storage capacitor;

forming the semiconductor layer and the first electrode of the storage capacitor on the gate insulating layer via a one-time patterning process;

forming a second insulating layer on the semiconductor layer and the first electrode of the storage capacitor, and forming a via hole that passes through the second insulating layer; and forming the source electrode, the drain electrode, and the data line on the second insulating layer via a one-time patterning process, wherein the source electrode and the drain electrode contact the semiconductor layer by the via hole on the second insulating layer, and wherein forming the semiconductor layer and the first electrode of the storage capacitor comprises:

forming a polysilicon semiconductor film;

forming a first insulating film on the polysilicon semiconductor film;

coating a photoresist on the first insulating film;

exposing and developing the photoresist via a graytone or halftone mask plate to form a photoresist completely-reserved region, a photoresist half-reserved region, and a photoresist completely-removed region, wherein the photoresist completely-reserved region corresponds to a semiconductor layer region, the photoresist half-reserved region corresponds to a storage capacitor region, and the photoresist completely-removed region corresponds to other regions;

removing the polysilicon semiconductor film and the first insulating film in the photoresist completely-removed region via an etching process;

removing the photoresist in the photoresist half-reserved region via an ashing process;

removing the first insulating film in the photoresist half-reserved region via an etching process to define a first insulating layer; and performing an ion doping operation by taking the first insulating film above the semiconductor layer region as a mask, and performing an annealing process to make the polysilicon semiconductor film in the storage capacitor region as a conductor and form a first electrode of the storage capacitor, wherein the polysilicon semiconductor film in the semiconductor layer region is protected by the first insulating film when performing the ion doping operation, such that the polysilicon semiconductor film in the semiconductor layer region remains a semiconductor.

16. The method according to claim 15, wherein the ion doping operation comprises doping with boron ions by using borane at a concentration of 10% as a reacting gas with an ion accelerating voltage of 10-50 kilovolts.

* * * * *